United States Patent
Tan et al.

(10) Patent No.: US 7,955,936 B2
(45) Date of Patent: Jun. 7, 2011

(54) SEMICONDUCTOR FABRICATION PROCESS INCLUDING AN SIGE REWORK METHOD

(75) Inventors: Yong Siang Tan, Singapore (SG); Chung Woh Lai, Singapore (SG); Jin-Ping Han, Fishkill, NY (US); Henry K. Utomo, Newburgh, NY (US); Judson R. Holt, Wappingers Falls, NY (US); Eric Harley, Lagrangeville, NY (US); Richard O. Henry, Wappingers Falls, NY (US); Richard J. Murphy, Clinton Corners, NY (US)

(73) Assignees: Chartered Semiconductor Manufacturing Ltd., Singapore (SG); International Business Machines Corporation, Armonk, NY (US); Infineon Technologies North America Corp., San Jose, CA (US); Infineon Technologies North America Corp., Neubiberg (DE)

(*) Notice: Subject to any disclaimer, the term of this patent is extended or adjusted under 35 U.S.C. 154(b) by 245 days.

(21) Appl. No.: 12/172,756

(22) Filed: Jul. 14, 2008

(65) Prior Publication Data

US 2010/0009502 A1 Jan. 14, 2010

(51) Int. Cl.
*H01L 21/336* (2006.01)
(52) U.S. Cl. .................................. 438/300; 257/E21.619
(58) Field of Classification Search .................. 438/300
See application file for complete search history.

(56) References Cited

U.S. PATENT DOCUMENTS

| 7,250,085 B2 | 7/2007 | Abbadie et al. |
| 7,335,545 B2 | 2/2008 | Currie |
| 2007/0161196 A1 | 7/2007 | Currie et al. |

*Primary Examiner* — W. David Coleman
(74) *Attorney, Agent, or Firm* — Brinks Hofer Gilson & Lione

(57) ABSTRACT

A method for fabricating a semiconductor device includes forming an SiGe region. The SiGe region can be an embedded source and drain region, or a compressive SiGe channel layer, or other SiGe regions within a semiconductor device. The SiGe region is exposed to an SC1 solution and excess surface portions of the SiGe region are selectively removed. The SC1 etching process can be part of a rework method in which overgrowth regions of SiGe are selectively removed by exposing the SiGe to and SC1 solution maintained at an elevated temperature. The etching process is carried out for a period of time sufficient to remove excess surface portions of SiGe. The SC1 etching process can be carried out at elevated temperatures ranging from about 25° C. to about 65° C.

19 Claims, 5 Drawing Sheets

SEMICONDUCTOR FABRICATION PROCESS INCLUDING AN SIGE REWORK METHOD

TECHNICAL FIELD

The invention relates, generally, to semiconductor fabrication methods and, more particularly, to fabrication of semiconductor devices including SiGe and SiGe etching methods.

BACKGROUND

As very-large-scale-integrated-circuits (VLSI circuits are scaled to smaller dimensions, continued improvement in device drive current is necessary. In a metal-oxide-semiconductor (MOS) device, drive current is determined, in part, by gate length, gate capacitance, and carrier mobility. At a given device size improved device current can be obtained by increasing the carrier mobility.

A widely used technique to enhance carrier mobility includes forming a strained silicon channel region. Strain or stress in the silicon lattice can enhance bulk electron and hole mobility through the crystalline lattice. The formation of a strained silicon region for fabrication of an MOS device channel is a relatively straight forward way to improve device performance without introducing process scaling complexity.

A common practice used to create strain in a silicon lattice is to form a layer of material adjacent to the silicon that has a lattice constant that differs from silicon. Both silicon germanium (SiGe) and silicon carbide (SiC) have been used in MOS device fabrication. Since the lattice constant of SiGe is larger than that of silicon, the lattice mismatch puts the silicon under tension and the charge carrier mobility increases though the strained silicon lattice. Similarly, the lattice constant of SiC differs from silicon, however, the type of strain created by SiC differs from that created by SiGe. Alloys such as SiGe create compressive strain in silicon, while SiC creates tensile strain in silicon. A bi-axial, in-plane tensile strain field can improve performance in n-type MOS devices, and compressive strain parallel to channel length direction can improve performance in p-type MOS devices.

In the case of silicon substrates, field effect transistors (FETs) are usually fabricated in silicon substrates having a <100> crystallographic surface orientation. In <100> silicon, the mobility of holes, which are the majority carrier in a p-channel FET (PFET), can be increased by applying a compressive longitudinal stress to the channel. A compressive longitudinal stress can be applied to the channel of FET by embedding SiGe in the silicon substrate at the ends of the transistor channel. As described above, an SiGe crystal has a greater lattice constant than the lattice constant of a silicon crystal, and consequently the presence of embedded SiGe causes a deformation of the silicon matrix that, in turn, compresses the silicon in the channel region.

In the manufacture of epitaxially grown embedded SiGe layers during semiconductor device fabrication, a cavity is typically created in the active area of the PFET device. The cavity is then filled with epitaxially grown SiGe material, which may be in-situ doped with a material such as boron. During the formation of an embedded SiGe structure, the SiGe may be overgrown in the cavity such that a facet is created at the edge of the active area of the transistor, adjacent a shallow trench isolation (STI) region. Such faceting can result undesirable junction leakage current, and adversely affects device performance.

Another method of increasing hole mobility in PMOS devices is to form a channel region including SiGe. This is typically accomplished by forming a compressively strained SiGe epitaxial layer (cSiGe) over silicon in the PMOS channel regions prior to forming the PMOS transistor gate. To fabricate the channel region, it is necessary to carefully control the epitaxially deposition process such that a cSiGe layer of precise thickness is formed. Overgrowth of SiGe can create current leakage paths in the channel region.

The formation of SiGe layers through the use of relatively straight forward epitaxial deposition processes creates strain that enhances carrier mobility in MOS devices. While epitaxial deposition techniques offer a ready means of forming SiGe, the epitaxial deposition can be difficult to control. As noted above, overgrowth of SiGe can have undesirable consequences on device performance and can lead to increased manufacturing costs if device substrates have to be discarded.

SUMMARY

In one embodiment, a method for fabricating a semiconductor device includes forming a SiGe region to a first thickness and in proximity to a second material. The SiGe region is exposed to an SC1 solution and an excess surface portion of the SiGe region is selectively removed, while avoiding the removal of substantial portions of the second material.

In another embodiment, a rework method in a semiconductor fabrication process includes forming an SiGe region to a first thickness. The first thickness is measured and compared to a target thickness and SiGe region is exposed to an SC1 solution at a solution temperature and for a period of time sufficient to reduce the thickness of the SiGe region to about the target thickness.

In yet another embodiment, a method for reworking an SiGe formation process includes forming an overgrowth of SiGe and exposing the SiGe to an SC1 solution at an elevated temperature. The SiGe overgrowth is removed while avoiding substantial removal of other material located in proximity to the SiGe overgrowth.

In still another embodiment, a method for reworking of a semiconductor substrate having an overgrowth of SiGe includes preparing an SC1 solution and controlling the temperature of the SC1 solution to a predetermined temperature above room temperature. An SiGe etch rate of the SC1 solution is determined and the SiGe is exposing the SC1 solution at the predetermined temperature for a predetermined period of time based on the SiGe etch rate, the SiGe overgrowth is selectively removed.

DETAILED DESCRIPTION

In accordance with various embodiments of the invention, a process is provided in which surface portions of an SiGe region or layer are removed by subjecting the SiGe to a solution known to those skilled in the art as "SC1." The SC1 solution was originally developed by Radio Corporation of America (RCA) and, in various formulations, includes hydrogen peroxide ($H_2O_2$), Ammonium Hydroxide ($NH_4OH$) and water ($H_2O$). The designation SC1 is shorthand notation for Standard Clean 1 and constitutes a portion of a wafer cleaning system traditionally is to clean semiconductor substrates during semiconductor device fabrication. The SC1 solution typically includes a ratio of $H_2O_2$ to $NH_4OH$ of about 4:1, however, various relative concentrations of $H_2O_2$ and $NH_4OH$ have also been used in various formulations in wafer cleaning operations.

In accordance with an aspect of the invention, an SC1 solution maintained at an elevated temperature is employed to remove surface layers of SiGe formed during a semiconductor fabrication process. The inventive process is particularly useful for reworking semiconductor substrates in which excess SiGe has been inadvertently formed.

Epitaxial processes used to grow SiGe can be difficult to control. In prior art semiconductor fabrication processes involving the formation of SiGe, often excessive amounts of SiGe are formed. In these instances, the substrates had to be scrapped because there was no practical solution for removing the excess SiGe. Given the difficulty in controlling an epitaxial SiGe growth process, significant production costs can be incurred when substrates having an overgrowth of SiGe are discarded.

In accordance with an aspect of the invention, the region or layer of SiGe formed on a semiconductor substrate is evaluated to determine if the proper amount of SiGe has been formed. In cases where an excess of SiGe is formed, the substrates are subjected to an SC1 solution and surface portions of the SiGe are removed. By selectively removing excess of SiGe, the semiconductor substrates can continue to be processed and active devices of high quality can be formed on the substrate. Currently, the inventive process operates to substantially reduce overall production costs in the fabrication of semiconductor devices that include regions and layers of SiGe.

Figure 1:
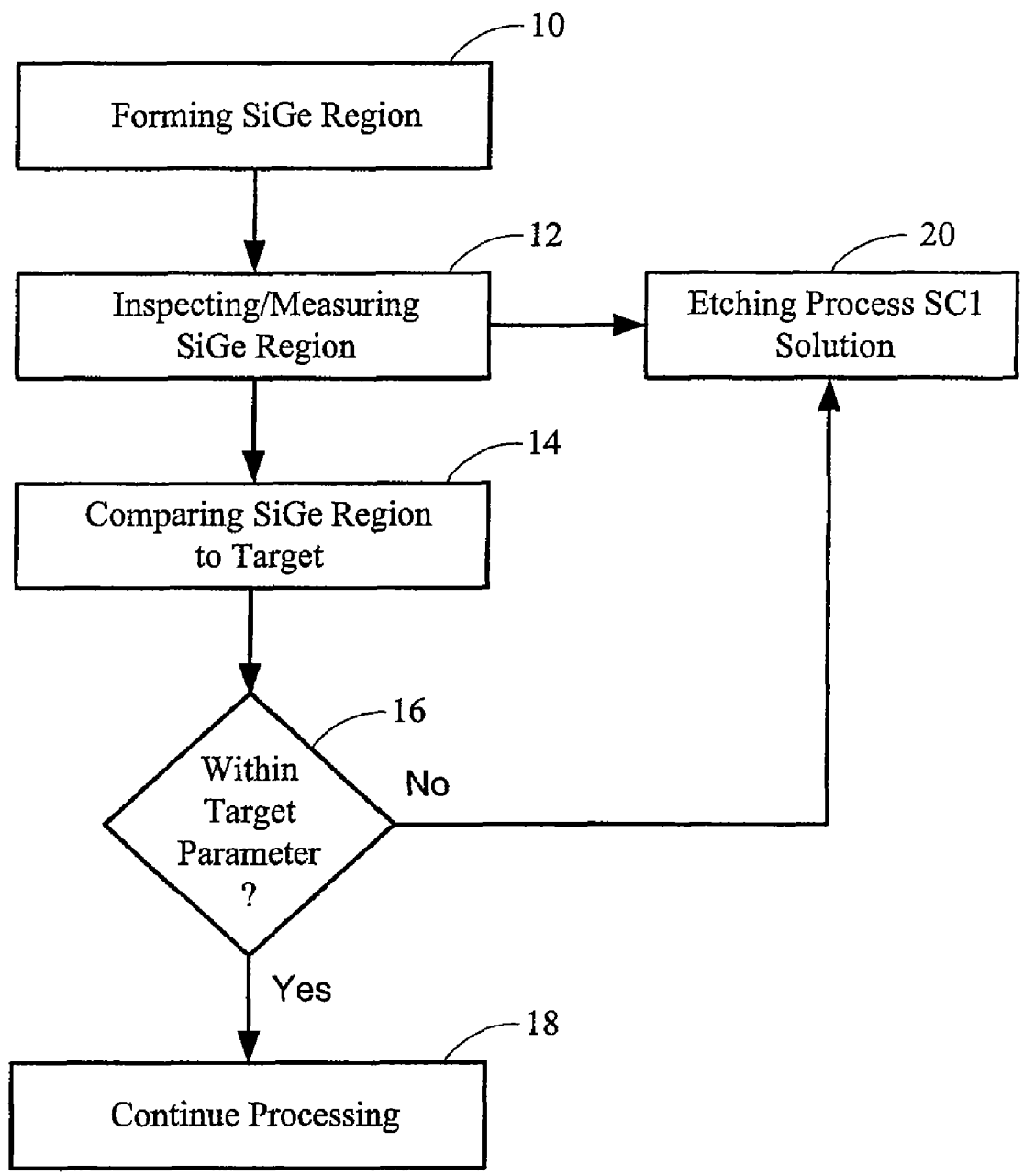
FIG. 1 illustrates a flow diagram for an SiGe rework method in accordance with one aspect of the invention.

FIG. 1 illustrates a flow diagram of a device and inspection rework process in accordance with an aspect of the invention. In step 10, an SiGe region is formed in a device fabrication process. The SiGe region can be, for example, an embedded SiGe region formed in a semiconductor substrate adjacent the channel region of an MOS transistor. Alternatively, the SiGe region can be a layer of SiGe formed as part of a channel region of an MOS transistor. In addition to embedded regions and channel layers, the inventive process can be used to remove surface portions of SiGe formed to create a variety of device structures.

Once the SiGe region is formed an inspecting or measuring process is carried out at step 12 to determine the extent of the SiGe formation. The inspecting or measuring process can include thickness measurements using measurement systems such as F5X and uXRD systems, visual inspections, various types of optical, electron, and ionic imaging processes. Further, the inspecting/measuring process can involve surface analysis, such as atomic force microscopy, and the like.

After evaluating the SiGe region, the SiGe region is compared to a target in step 14. The method of comparison to a target can include variety of techniques such as the comparison to a standard thickness measurement, surface area coverage, geometric analysis, and the like.

Once the comparison is made, an evaluation is carried out at step 16 to determine if the SiGe region is within predefined target parameters. The target parameters can include a number of different quantitative and qualitative parameters. For example, the predetermined target parameters can be defined by various statistical analysis of population distributions of numeric values, statistical analysis of as thickness, aerial coverage, volume, morphology, and the like. Further, the predefined target parameters can be defined by comparison with standardized geometric patterns, mask overlays, and the like. Additionally, the target parameters can also be electrical parameters, such as electrical resistance, conductance, capacitance, and the like.

After comparing the SiGe region with the predefined target parameter, where the SiGe region is within the predefined target parameter, processing continues at step 18 and subsequent device fabrication processes are carried out to complete fabrication of the semiconductor device. Alternatively, where the SiGe region is determined to fall outside the predefined target parameter, the SiGe region is subjected to an SC1 etching solution at step 20. Preferably, the SC1 solution is maintained at a predetermined elevated temperature.

In accordance with one aspect of the invention, the etching characteristics of the SC1 solution are calibrated to precisely determine an SiGe etch rate. The amount of SiGe removed from test wafers at three different SC1 solution temperatures are shown below in Table 1. The etching parameters shown in Table 1 were determined by depositing a layer of SiGe by chemical vapor deposition (CVD) using Silane $SiH_4$ and 20% Ge. The deposition process was carried out at 720° C. with an 85° C. pre-bake.

TABLE 1

| | SC1 Solution Amount of SiGe Removed (Angstroms) | | |
|---|---|---|---|
| | Temperature | | |
| | 25° C. | 45° C. | 65° C. |
| Wafer 1 | 52.1 | 12.3 | 2.8 |
| Wafer 2 | 50.2 | 8.6 | 2.6 |
| Wafer 3 | 44.4 | 10.4 | 2.9 |
| Wafer 4 | 48.2 | 10.7 | 2.7 |

The data indicates that the SiGe etch rate substantially increases with increasing SC1 solution temperature. The relative SC1 etch uniformity is shown below in Table 2.

TABLE 2

| | SC1 Solution SiGe Etch Uniformity (%) | | |
|---|---|---|---|
| | Temperature | | |
| | 25° C. | 45° C. | 65° C. |
| Wafer 1 | 2.2 | 5.5 | 6.5 |
| Wafer 2 | 2.8 | 5.7 | 4.2 |
| Wafer 3 | 3.9 | 4.0 | 6.9 |
| Wafer 4 | 3.2 | 4.8 | 7.0 |

The data of Table 2 indicates that the etching uniformity generally improves with increasing SC1 solution temperature.

By determining the SiGe etching characteristics of the SC1 solution, the solution temperature and etching time can be determined to remove a selected amount of SiGe. Accordingly, the inventive process permits the removal of an SiGe overgrowth, while substantially avoiding excess removal of SiGe.

In addition to rapidly and uniformly etching SiGe, the SC1 solution also exhibits etch selectivity to a variety of materials commonly used in semiconductor device fabrication. For example, the SC1 solution will not remove substantial amounts of silicon, silicon oxide, silicon nitride, and the like. Accordingly, the SC1 solution can be applied to selectively remove a precise amount of SiGe, while avoiding the removal of substantial portions of other materials present during the etching process. In a preferred embodiment, the rework process is carried out with an SC1 solution at a temperature of at least about 45° C. and, more preferably, at a temperature of about 65° C. In other embodiments, the inventive process is carried out with an SC1 solution at a temperature range of about 45° C. to about 65° C. Depending upon the particular device in fabrication and the materials employed to fabricate the device, other SC1 solution temperatures are possible, such as at least about 25° C. and ranging to higher temperatures up to and including about 65° C.

Figure 2:
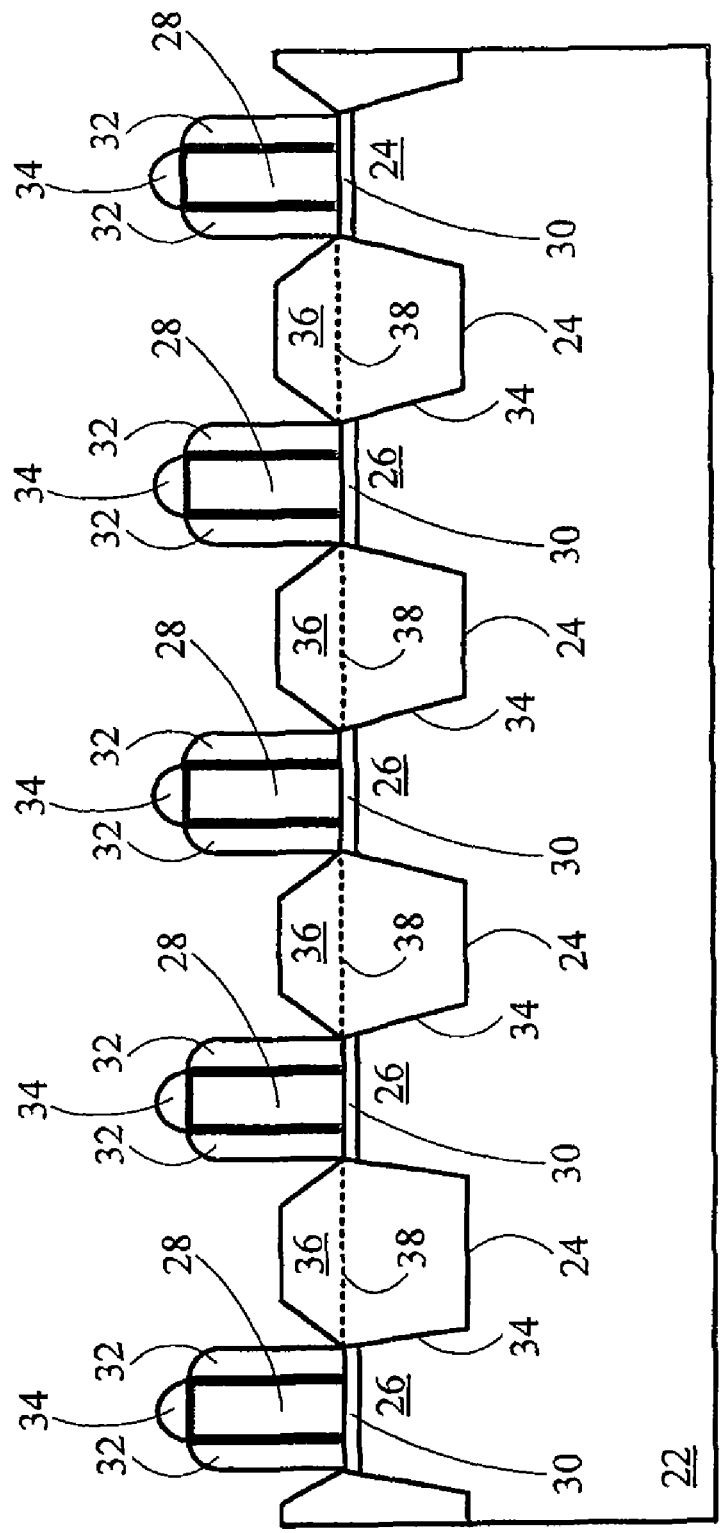
FIG. 2 illustrates in cross-section, a portion of a semiconductor substrate having already undergone several processing steps to form SiGe embedded source and drain regions.
Figure 3:
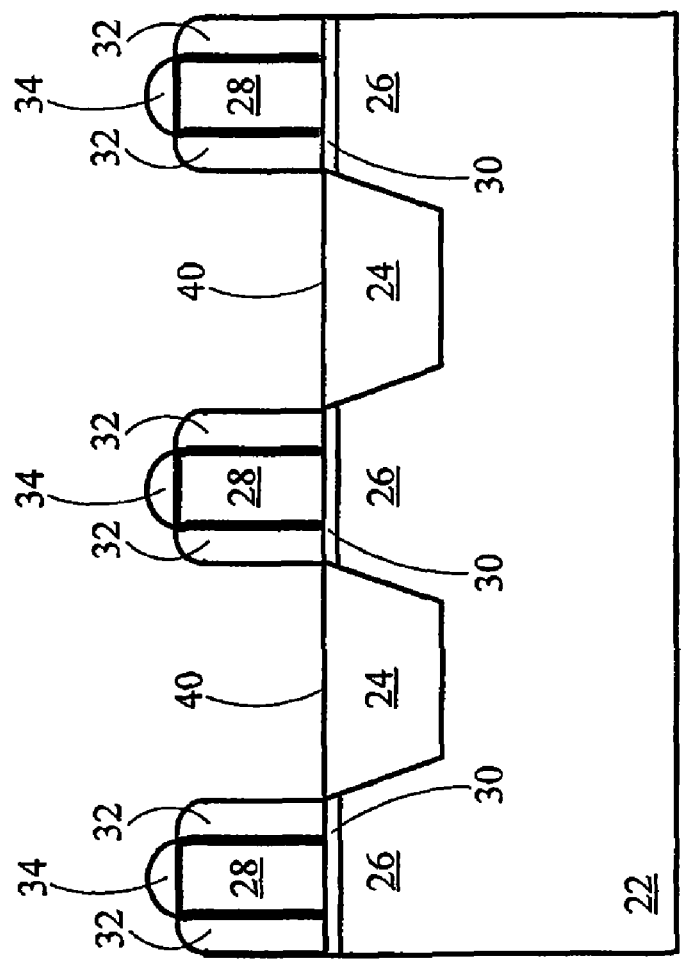
FIG. 3 illustrates in cross-section, a portion of a semiconductor substrate shown in FIG. 2 after an SiGe etching process carried out in accordance with an aspect of the invention.

A process for removing an overgrowth of SiGe in a device having embedded SiGe source and drain regions is schematically illustrated in FIGS. 2 and 3. A semiconductor substrate 22 includes embedded SiGe source and drain regions 24. The embedded SiGe regions are located proximate to channel regions 26, which in turn underlie MOS gate electrodes 28. The MOS gate electrodes are separated from channel regions 26 by a gate dielectric layer 30. Each gate electrode is flanked by sidewall spacers 32 and covered by a capping layer 34.

In the device illustrated in FIG. 2, SiGe source and drain regions 24 have been formed by an epitaxial deposition process. The process is carried out by epitaxially depositing SiGe into recesses 34 formed in semiconductor substrate 22. During the epitaxial SiGe deposition process, successive layers of SiGe are sequentially formed eventually filling recesses 34, such that a region of SiGe occupies recesses 24.

In the process used to form SiGe embedded source and drain regions 24, the epitaxial deposition process was not properly terminated and overgrowth regions 36 were formed. Ideally, the SiGe embedded source and drain regions should have an upper surface identified by dashed line 38. In the ideal process, the SiGe source and drain regions have an upper surface that is substantially flush with the upper surface of gate dielectric layers 30. In the case of the process used to form SiGe source and drain regions 24, the deposition process was not terminate soon enough to prevent the formation of overgrowth regions 36. As described above, in device fabrication processes of the prior art, once overgrowth regions 36 are formed, the substrate 22 would be scrapped. This results in a complete loss of the partially formed devices on semiconductor substrate 22 and the production costs incurred in fabricating the devices to the degree of completion illustrated in FIG. 2.

In accordance with the invention, rather than scrapping semiconductor substrate 22, a rework process is carried out in which overgrowth regions 36 are removed. In accordance with an aspect of the invention, semiconductor substrate is exposed to an SC1 solution maintained at a predetermined temperature. The etching process is carried out for a predetermined period of time in order to substantially remove overgrowth regions 36. As illustrated in FIG. 3, upon completion of the SC1 etching process, SiGe source and drain regions 24 have an upper surface 40 that is substantially uniform across semiconductor substrate 22 and substantially aligned with gate dielectric layers 30. Accordingly, semiconductor substrate 22 can continue processing to complete the fabrication of semiconductor devices and avoid production losses associated with the prior art procedure of scrapping the substrate.

Importantly, the SC1 etching process removes overgrowth regions 36, while substantially avoiding etching of sidewall spaces 32, capping layers 34, and other exposed materials on substrate 22. Thus, the inventive process permits the removal of excess SiGe, while maintaining the structural integrity of adjacent regions of the semiconductor devices.

Figure 4:
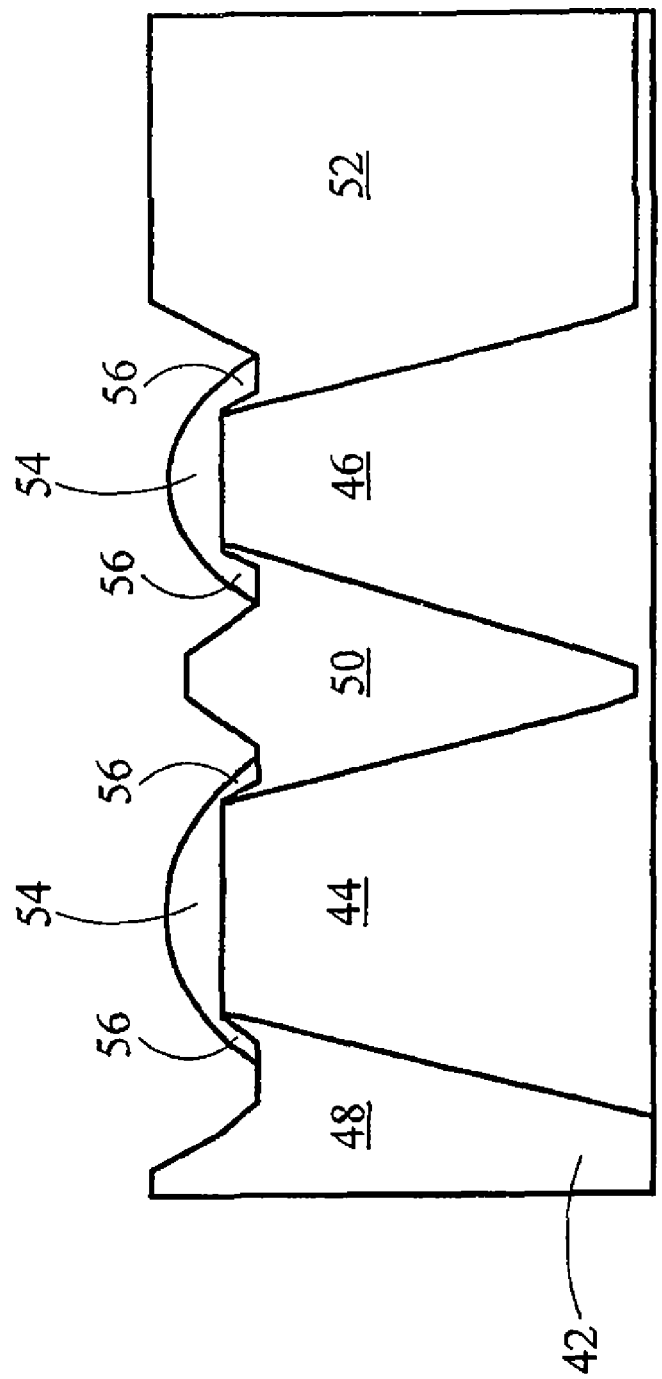
FIG. 4 illustrates in cross-section, a portion of a semiconductor substrate having already undergone several processing steps to form a compressive SiGe channel layer.
Figure 5:
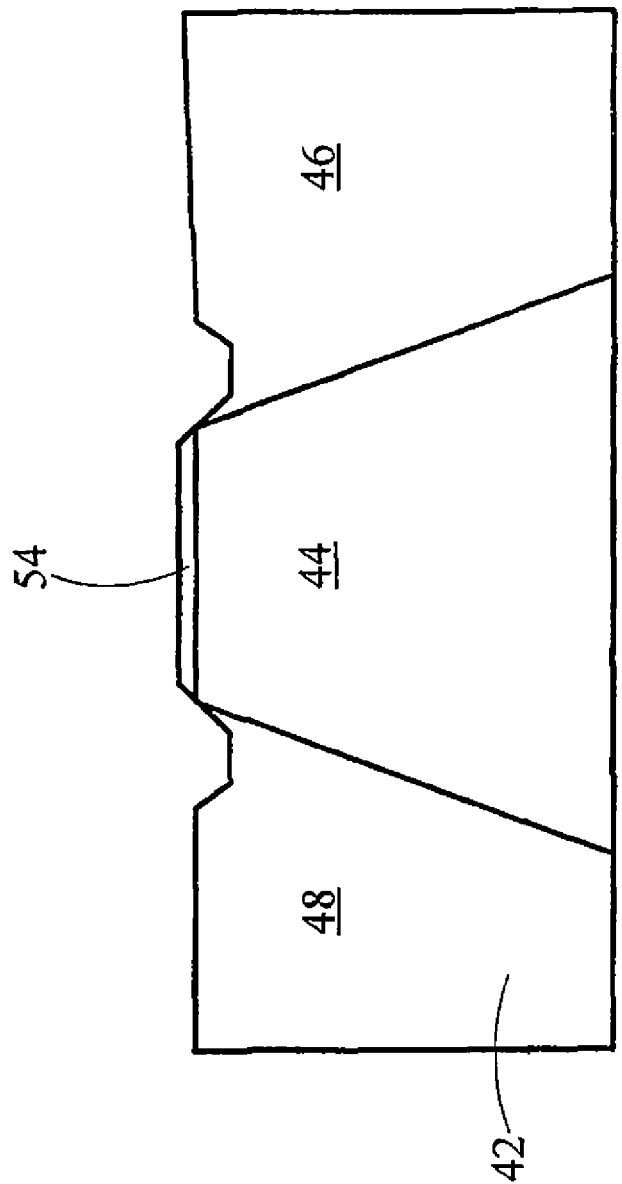
FIG. 5 illustrates in cross-section, a portion of a semiconductor substrate shown in FIG. 4 after an SiGe etching process carried out in accordance with an aspect of the invention.

In accordance with another embodiment of the invention, a process for removing an overgrowth of SiGe in a device having SiGe channel layers is schematically illustrated in FIGS. 4 and 5. FIG. 4 schematically illustrates a portion of a semiconductor device 42 that includes channel regions 44 and 45 flanked by source and drain regions 48, 50 and 52. A layer of compressive SiGe (cSiGe) 54 is formed over channel regions 44 and 46. The cSiGe layer has been formed by CVD with the intent of forming a precisely defined region of cSiGe overlying channel regions 44 and 46. During the chemical vapor deposition process, excessive SiGe was formed and overgrowth regions 56 were formed that extend beyond the surface area of source and drain regions 44 and 46. In similarity to the process described above, once the excessive cSiGe is formed, the prior art procedure was simple to scrap semiconductor substrate 42.

In accordance with the inventive process, the rework procedure illustrated in FIG. 1 can be carried out to remove overgrowth region 56 in the cSiGe layer. Upon application of the SC1 solution, overgrowth regions 56 are removed, as illustrated in FIG. 5. After removing the excess cSiGe, channel layer 54 precisely overlies channel region 44 and has the desired thickness. Accordingly, semiconductor substrate 42 can continue processing and the semiconductor devices can be formed without incurring production loss.

In accordance with the invention, there has been described a semiconductor fabrication process including an SiGe rework method that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, various etching techniques, such as re-circulating bath, liquid spray emersion, and solution rinsing methods can be carried out. It is therefore intended to include within the invention all variations and modifications that fall within the scope of the appended claims and equivalents thereof.

The invention claimed is:

1. A method for fabricating a semiconductor device, the method comprising:
   forming a compressive SiGe region by an expitaxial deposition process to a first thickness and in proximity to an active region of the semiconductor device,
   wherein the expitaxial deposition process produces excess SiGe beyond a required amount;
   exposing the SiGe region to an SC1 solution a temperature of at least about 45° C.; and
   selectively removing an excess surface portion of the compressive SiGe region, while avoiding the removal of substantial portions of the active region.

2. The method of claim 1, wherein forming a compressive SiGe region comprises forming an embedded SiGe region in a recess of a semiconductor substrate.

3. The method of claim 1, wherein forming a compressive SiGe region comprises forming an SiGe layer in proximity to a transistor channel region.

4. The method of claim 1, wherein exposing the SiGe region to an SC1 solution comprises exposing to an SC1 solution at a temperature of about 45° C. to about 65° C.

5. The method of claim 2, wherein forming a compressive SiGe region to a first thickness comprises overfilling the recess.

6. The method of claim 5, wherein selectively removing an excess surface portion of the compressive SiGe region comprises removing surface portions of the compressive SiGe region such that the compressive SiGe region is substantially flush with a top portion of the recess.

7. In a semiconductor fabrication process, a rework method to avoid scrapping a semiconductor substrate, the method comprising:
   forming an SiGe region in the semiconductor substrate to a first thickness greater than a target thickness;
   measuring the first thickness;
   comparing the first thickness to the target thickness; and
   exposing the SiGe region to an SC1 solution at a solution temperature and for a period of time sufficient to reduce the thickness of the SiGe region to about the target thickness, while avoiding the removal of substantial portions of the semiconductor substrate.

8. The method of claim 7, wherein exposing the SiGe region to an SC1 solution comprises exposing the SiGe region to an SC1 solution at a temperature of at least about 45° C.

9. The method of claim 7, wherein forming an SiGe region comprises forming embedded transistor source and drain regions.

10. The method of claim 7, wherein exposing the SiGe region to an SC1 solution comprises reducing the thickness of the SiGe region comprises removing an overgrowth of SiGe.

11. The method of claim 7, wherein forming an SiGe region comprises forming an SiGe layer in proximity to a transistor channel region.

12. The method of claim 11, wherein exposing the SiGe region to an SC1 solution comprises to reduce the thickness of the SiGe region comprises removing an overgrowth of SiGe.

13. A method for reworking an SiGe formation process to avoid scrapping the semiconductor substrate, the method comprising:
   forming an overgrowth of SiGe beyond a required amount of SiGe;
   exposing the SiGe overgrowth to an SC1 solution at an elevated temperature of at least about 45° C.;
   removing the SiGe overgrowth while avoiding substantial removal of other semiconductor material located in proximity to the SiGe overgrowth; and
   continuing to process the semiconductor substrate.

14. The method of claim 13, wherein forming an overgrowth of SiGe comprises forming an embedded SiGe region in a recess of the semiconductor substrate.

15. The method of claim 13, wherein forming a SiGe overgrowth comprises forming an SiGe layer in proximity to a transistor channel region.

16. The method of claim 13, wherein exposing the SiGe overgrowth to an SC1 solution comprises exposing the SiGe overgrowth to an SC1 solution at a temperature of about 45° C. to about 65° C.

17. The method of claim 14, wherein removing the overgrowth comprises removing surface portions of the embedded SiGe region such that the SiGe region is substantially flush with a top portion of the recess.

18. The method of claim 15, wherein removing the SiGe overgrowth comprises removing a lateral overgrowth.

19. A method for reworking of a semiconductor substrate having an overgrowth of SiGe beyond a required amount of SiGe, the method comprising:
   preparing an SC1 solution;
   controlling the temperature of the SC1 solution to a predetermined temperature above room temperature;
   measuring an SiGe etch rate of the SC1 solution;
   exposing the SC1 solution to the SiGe overgrowth at the predetermined temperature for a predetermined period of time based on the SiGe etch rate; and
   selectively removing the SiGe overgrowth while avoiding the removal of substantial portions of the semiconductor substrate.

* * * * *